(12) United States Patent
Claveau et al.

(10) Patent No.: US 10,784,108 B2
(45) Date of Patent: Sep. 22, 2020

(54) METHOD FOR FORMING A FUNCTIONALISED ASSEMBLY GUIDE

(71) Applicant: COMMISSARIAT A L'ENERGIE ATOMIQUE ET AUX ENERGIES ALTERNATIVES, Paris (FR)

(72) Inventors: Guillaume Claveau, Grenoble (FR); Maxime Argoud, La Chapelle de la Tour (FR); Nicolas Posseme, Sassenage (FR); Raluca Tiron, Saint-Martin-le-Vinoux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/343,774

(22) PCT Filed: Oct. 20, 2017

(86) PCT No.: PCT/FR2017/052890
§ 371 (c)(1),
(2) Date: Apr. 21, 2019

(87) PCT Pub. No.: WO2018/073550
PCT Pub. Date: Apr. 26, 2018

(65) Prior Publication Data
US 2019/0267233 A1    Aug. 29, 2019

(30) Foreign Application Priority Data

Oct. 21, 2016  (FR) ...................................... 16 60231

(51) Int. Cl.
*H01L 21/033*  (2006.01)
*G03F 7/00*    (2006.01)
(Continued)

(52) U.S. Cl.
CPC ...... *H01L 21/0338* (2013.01); *B81C 1/00031* (2013.01); *B81C 1/00388* (2013.01);
(Continued)

(58) Field of Classification Search
None
See application file for complete search history.

(56) References Cited

U.S. PATENT DOCUMENTS

2007/0275332 A1* 11/2007 Bandic ................... B82Y 10/00
                                                           430/320
2010/0203299 A1*  8/2010 Abdallah ................... G03F 7/40
                                                          428/195.1
(Continued)

FOREIGN PATENT DOCUMENTS

EP    2 998 981 A1    3/2016
EP    3 125 320 A1    2/2017
(Continued)

OTHER PUBLICATIONS

J. Bang et al., Block Copolymer Nanolithography: Translation of Molecular Level Control to Nanoscale Patterns, Adv. Mater. vol. 21, pp. 4769-4792. (Year: 2009).*
(Continued)

*Primary Examiner* — Jiong-Ping Lu
(74) *Attorney, Agent, or Firm* — Pillsbury Winthrop Shaw Pittman LLP

(57) ABSTRACT

A method for forming a functionalised assembly guide intended for the self-assembly of a block copolymer by graphoepitaxy, includes forming on the surface of a substrate a neutralisation layer made of a first material having a first neutral chemical affinity with regard to the block copolymer; forming on the neutralisation layer a first mask including at least one recess; depositing on the neutralisation layer a second material having a second preferential chemical affin-
(Continued)

ity for one of the copolymer blocks, in such a way as to fill the at least one recess of the first mask; and selectively etching the first mask relative to the first and second materials, thereby forming at least one guide pattern made of the second material arranged on the neutralisation layer.

16 Claims, 5 Drawing Sheets

(51) Int. Cl.
| | |
|---|---|
| *H01L 21/02* | (2006.01) |
| *H01L 21/027* | (2006.01) |
| *H01L 21/3105* | (2006.01) |
| *H01L 21/311* | (2006.01) |
| *B81C 1/00* | (2006.01) |
| *H01L 21/308* | (2006.01) |

(52) U.S. Cl.
CPC ........ *G03F 7/0002* (2013.01); *H01L 21/0271* (2013.01); *H01L 21/02118* (2013.01); *H01L 21/0337* (2013.01); *H01L 21/3086* (2013.01); *H01L 21/3088* (2013.01); *H01L 21/31055* (2013.01); *H01L 21/31111* (2013.01); *H01L 21/31144* (2013.01); *B81C 2201/0149* (2013.01)

(56) References Cited

U.S. PATENT DOCUMENTS

2016/0131811 A1\* 5/2016 Lee ..................... G02B 5/3058
359/485.05
2016/0244581 A1 8/2016 Brink et al.

FOREIGN PATENT DOCUMENTS

| FR | 3 021 321 A1 | 11/2015 |
|---|---|---|
| KR | 10-2016-0032702 A | 3/2016 |

OTHER PUBLICATIONS

International Search Report as issued in International Patent Application No. PCT/FR2017/052890, dated Jan. 2, 2018.
Pimenta Barros, P., et al., "Etch challenges for DSA implementation in CMOS via patterning," Advanced Etch Technology for Nanopatterning III, 10 pages, SPIE, (2014).
Jeong, S.-J., et al., "Soft Graphoexpitaxy of Block Copolymer Assembly with Disposable Photoresist," Nano Letters, vol. 9, No. 6, 2300-2305, (2009).
Search Report as issued in French Patent Application No. 1660231, dated Jul. 11, 2017.
Tiron, R., et al., "Template affinity role in CH shrink by DSA planarization," Alternative Lithographic Technologies VII, SPIE, 11 pages, (2015).

\* cited by examiner

METHOD FOR FORMING A FUNCTIONALISED ASSEMBLY GUIDE

CROSS REFERENCE TO RELATED APPLICATIONS

This application is the U.S. National Stage of PCT/FR2017/052890, filed Oct. 20, 2017, which in turn claims priority to French Patent Application No. 1660231 filed Oct. 21, 2016, the entire contents of all applications are incorporated herein by reference in their entireties.

TECHNICAL FIELD

The present invention relates to a method for forming a functionalised assembly guide intended for the self-assembly of a block copolymer. The present invention also relates to a graphoepitaxy method using a functionalised assembly guide obtained by such a method.

PRIOR ART

The need for methods making it possible to produce patterns of nanometric dimensions has increased considerably over recent years, on account of the tendency towards miniaturisation of electronic components.

Among emerging lithography technologies, it is possible to cite techniques of directed self-assembly (DSA) of block copolymers. Block copolymers are polymers in which two repeating units, a monomer A and a monomer B, form chains bound together by a covalent bond. When the chains are given sufficient mobility, for example by heating these block copolymers, the chains of monomer A and the chains of monomer B have a tendency to separate into phases or blocks of polymer and to reorganise into specific conformations, which depend notably on the ratio between the monomer A and the monomer B. As a function of this ratio, it is possible to have spheres of A in a matrix of B, or cylinders of A in a matrix of B, or instead intercalated lamella of A and lamella of B.

Block copolymers thus have the property of forming polymer patterns that can be controlled thanks to the ratio of the monomers A and B. The periodicity of these patterns is directly linked to the molar mass of the block copolymers. Thus, by controlling this molar mass, it is possible to control the resolution of the polymer patterns formed by the block copolymers.

The properties of block copolymers are exploited within the scope of graphoepitaxy methods. Graphoepitaxy consists in forming primary patterns called "guide patterns" on the surface of a substrate, each guide pattern delimiting a cavity inside of which a block copolymer layer is deposited. The guide patterns make it possible to control the organisation of the copolymer blocks to form secondary patterns of higher resolution inside the cavities. Indeed, the mechanical strain exerted on the copolymer layer by the guide patterns and the chemical interactions of the copolymer with the sides of the guide patterns favour the separation of the phases. The guide patterns are conventionally formed by photolithography in a resin layer, and optionally, transferred into a hard mask.

It is often difficult to control the orientation of the secondary patterns relative to a guide pattern. Indeed, the orientation of the secondary patterns relative to the guide pattern depends on the interactions of the blocks of monomer with the surface of the guide pattern, with the substrate and with air. In the case of the PS-b-PMMA block copolymer, the interactions of the two phases—polystyrene (PS) and polymethyl methacrylate (PMMA)—with air are equivalent.

If the bottom and the side walls of the cavity have the same preferential affinity with one of the two phases of the block copolymer, for example PS, then this phase will extend over the sides of the guide pattern and over the substrate. In other words, the other phase of the copolymer, PMMA, will not extend over the whole height of the guide pattern on account of a residual layer of PS situated at the interface with the substrate. Yet this residual layer is detrimental for the transfer, into the substrate, of holes obtained by the selective etching of the PMMA phase.

The most advantageous configuration is to generate a cavity having a neutral bottom (equivalent interactions of the two blocks with the substrate) and side walls having a preferential affinity with one of the two polymer phases. In this case, the other polymer phase (that which will be etched selectively) extends up to the interface with the substrate.

A control of the surface affinities, which is selective between the bottom and the side walls of the cavity, is consequently necessary.

A conventional technique consists in grafting a neutralisation layer to the bottom of the cavity, whereas the walls of the cavity remain bare (the guide pattern having, by default, a preferential affinity for one of the phases). To do so, a random polymer is diluted, then deposited by spin coating inside the guide pattern. This technique does not allow the possibility of selecting the affinity of the side walls of the cavities, because this is dictated by the material of which the cavity is made. Furthermore, any treatment (deposition, plasma, etc.) aiming to modify the affinity of the walls of the cavity will also affect the bottom of the cavity. In addition, this technique gives good results for a single cavity or for several cavities of same dimensions regularly distributed on the substrate. However, from the moment that the density of the cavities varies within the assembly guide, the random polymer layer is also deposited on the side walls of the cavities in the least dense zones of the assembly guide.

FIGS. 1A and 1B illustrate the steps of a method for forming a functionalised assembly guide 100, as described in the document ["Soft Graphoexpitaxy of Block Copolymer Assembly with Disposable Photoresist", Seong-Jun Jeong et al., Nano Letters, vol. 9, No. 6, 2300-2305, 2009]. At the step of FIG. 1A, a substrate 101 is covered with a neutralisation layer 102 made of random copolymer, then a negative tone development resist resin layer 103. The assembly guide 100 is formed by photolithography, by exposing a part only of the resin layer 103 to deep ultraviolet (DUV) then by developing the resin layer. During the development step represented by FIG. 1B, the portions of the resin layer 103 not exposed to the ultraviolet are removed in order to form the cavities 104. The neutralisation layer 102 constitutes the bottom of the cavities 104.

This second technique resolves the problem linked to the variable density of cavities, but has two major drawbacks. The use of a resin to form the assembly guide does not always allow the possibility of selecting the affinity of the side walls of the cavities, because this is dictated by the chemistry of the resin. For example, for the block copolymer PS-b-PMMA, the negative tone development resist resin of the aforementioned document has an affinity for polystyrene. Any treatment (deposition, plasma, etc.) aiming to modify the affinity of the walls of the cavities will also affect the bottom of the cavities. Thus, control of the interactions with the block copolymer deposited in the cavities will be limited in this method of the prior art. Besides, the resin has poor thermal resistance which reduces the possibilities of annealing for the assembly of the block copolymer or implies dimensional variations of the assembly guide (the sides made of resin of the assembly guide are deformed on heating).

SUMMARY OF THE INVENTION

It therefore exists a need to provide a method for forming an assembly guide making it possible to select freely the chemical affinities of the bottom and the side walls of the cavities with regard to the block copolymer.

According to the invention, this need tends to be satisfied by providing the following steps:
  forming on the surface of a substrate a functionalisation layer made of a first material having a first chemical affinity with regard to the block copolymer;
  forming on the functionalisation layer a first mask comprising at least one recess;
  depositing on the functionalisation layer a second material having a second chemical affinity with regard to the block copolymer, in such a way as to fill said at least one recess of the first mask;
  selectively etching the first mask relative to the first and second materials, thereby forming at least one guide pattern made of the second material arranged on the functionalisation layer.

The term "assembly guide" used above designates a structure making it possible to guide (or direct) the self-assembly of the block copolymer. This structure comprises the functionalisation layer formed of the first material and one or more guide patterns formed of the second material.

The guide patterns, comprised of the second material, thereby correspond to the complementary part of the mask formed on the functionalisation layer. Depending on their number and their geometry, fixed by the number and the shape of the recesses of the mask, the guide patterns delimit (at least in part) one or more cavities intended to be filled with a block copolymer. The bottom of each cavity is comprised of the functionalisation layer formed of the first material and consequently has the first chemical affinity. The side walls of the cavity are formed by the sides of the guide pattern made of second material and consequently have the second chemical affinity.

The chemical affinity of the side walls of the cavity is thus no longer dictated by the material of the mask, but by the second material deposited in the recess of the mask. This second material may be specially selected as a function of the desired affinity. Thus, the formation method according to the invention enables great freedom in the control of interactions with the block copolymer. This freedom with regard to the affinity of the walls is not achieved to the detriment of the affinity of the cavity bottom since this bottom is protected during the greater part of the method by the solid parts of the mask.

This method also offers the possibility, to form the assembly guide, of selecting a second material having good thermal resistance, that is to say capable of withstanding high temperatures without degrading or deforming. This makes it possible to resort, for the remainder of the graphoepitaxy method, to assembly or grafting annealings at higher temperature or for longer duration.

Thanks to this method, it is henceforth possible to form easily an assembly guide comprising at least one cavity of which the walls have a chemical affinity different from that of the bottom of the cavity, in other words a second affinity different from the first affinity.

Advantageously, the second material is deposited in such a way as to fill fully said at least one recess of the first mask and to form an extra thickness above the first mask. The method then comprises, before the step of etching the first mask, a step consisting in removing the extra thickness in order to uncover the first mask.

Thus, since the second material is deposited so as to extend beyond the mask (in which is printed the reverse of the assembly guide) then finally planed down to be able to remove the mask, the method according to the invention is insensitive to variations in the density of the recesses (i.e. the opening ratio) in the mask.

The first and second chemical affinities may be selected from the following possibilities:
  preferential affinity for any one of the copolymer blocks; or
  neutral, that is to say without preference for any one of the copolymer blocks (or equivalent for each of the copolymer blocks).

When a material or a surface, for example the bottom of the cavities, is designated "neutral" with regard to the block copolymer, this signifies that the interaction forces with the different copolymer blocks are equivalent.

According to a development of the method according to the invention, the first material is neutral relative to the blocks of the block copolymer and the second material has a preferential affinity for one of the blocks of the block copolymer.

Preferably, the first mask is etched by wet process. Thus, the chemical affinity of the functionalisation layer with regard to the block copolymer does not risk being modified. Conversely, in methods of the prior art, resort is often made to a step of etching or opening the mask by plasma, which alters the affinity of the functionalisation layer located under the mask.

According to a development, the formation method further comprises the following steps:
  forming on the functionalisation layer a second mask comprising at least one recess;
  depositing a third material having a third chemical affinity with regard to the block copolymer, in such a way as to fill said at least one recess of the second mask; and
  selectively etching the second mask relative to the first, second and third materials, thereby forming at least one pattern made of the third material arranged on the functionalisation layer.

The first and second masks are preferably formed successively in a same inorganic layer and etched simultaneously. Alternatively, the second mask is formed on the functionalisation layer after etching the first mask.

The method according to the invention may also have one or more of the characteristics below, considered individually or according to all technically possible combinations thereof:
  said at least one guide pattern delimits at least in part a cavity of depth comprised between 50 nm and 300 nm;
  the extra thickness of the second material is removed by chemical mechanical planarization;
  the extra thickness of the second material is removed by plasma etching;
  the extra thickness of the second material has a flat surface and the second material is etched uniformly;
  the functionalisation layer is formed of a polymer of which the surface energy corresponds to a neutrality regime of the block copolymer intended to occupy the cavities of the guide. It may notably be a random copolymer of same chemical nature (i.e. comprising the same monomers) as the block copolymer;

the second material is selected from a cross-linkable polymer (for example a styrene derivative or a methacrylate derivative), a silicon oxide, a silicon nitride, a titanium nitride, a metal such as gold, copper, platinum and palladium;

the first mask is a hard mask comprising an antireflective layer;

the first mask comprises a photosensitive resin layer;

the method further comprises the conformal deposition of a stop layer on the photosensitive resin layer; and said at least one recess of the first mask and/or said at least one recess of the second mask open onto the functionalisation layer.

The invention also relates to a graphoepitaxy method comprising the formation of an assembly guide using the method described above, the assembly guide delimiting at least one cavity, and the deposition of a block copolymer inside the cavity.

BRIEF DESCRIPTION OF THE FIGURES

Other characteristics and advantages of the invention will become clear from the description that is given thereof below, for indicative purposes and in no way limiting, with reference to the appended figures, among which.

For greater clarity, identical or similar elements are marked by identical reference signs in all of the figures.

DETAILED DESCRIPTION OF AT LEAST ONE EMBODIMENT

Figure 1A:
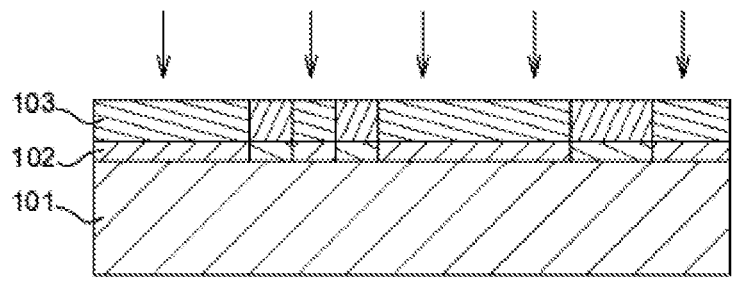
FIGS. 1A and 1B represent the steps of a method for forming a functionalised assembly guide according to the prior art.
Figure 1B:
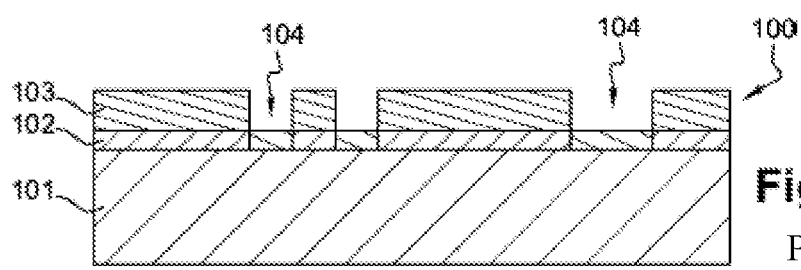
Figure 2:
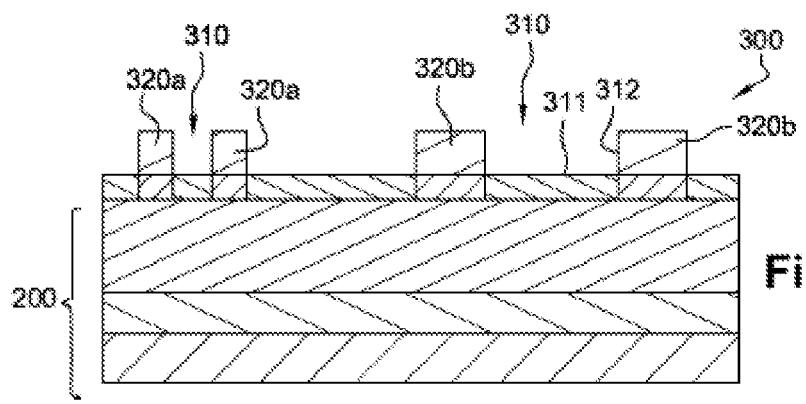
FIG. 2 illustrates a functionalised assembly guide obtained by the formation method according to the invention.

With reference to FIG. 2, the method according to the invention makes it possible to obtain on the surface of a substrate 200 a functionalised assembly guide 300 comprising one or more cavities 310. Each cavity 310 is intended to be filled with a block copolymer in order to form therein at least one secondary pattern of high resolution, by directed self-assembly of the block copolymer. The bottom 311 of the cavities 310 is functionalised in such a way as to have a first chemical affinity with regard to the block copolymer, whereas the side walls 312 of the cavities are functionalised so as to have a second chemical affinity with regard to the block copolymer. The side walls 312 of the cavities extend, preferably, perpendicularly to the plane of the substrate 200.

The cavities 310 of the assembly guide 300 may adopt different geometries. They may notably take the shape of a cylindrical well, a rectangular or elliptical well, a trench or any other shape suited to graphoepitaxy methods. The cavities 310 preferably have a depth comprised between 50 nm and 300 nm.

FIGS. 3A to 3F represent the steps S1 to S6 making it possible to manufacture such a functionalised assembly guide 300, according to a preferential embodiment of the method according to the invention.

Figure 3A:
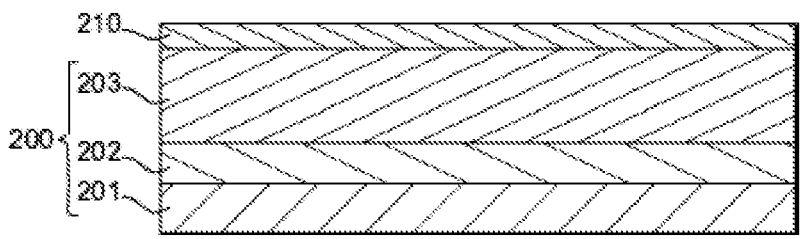
FIGS. 3A to 3F represent the steps S1 to S6 making it possible to manufacture the functionalised assembly guide of FIG. 2, according to a preferential embodiment of the method according to the invention.

The first step S1, illustrated by FIG. 3A, consists in forming a functionalisation layer 210 on the surface of the substrate 200. The functionalisation layer 210 is comprised of a first material, selected as a function of the chemical affinity that it is wished to give to the bottom of the cavities of the assembly guide. This first material is preferably a polymer material, graftable or cross-linkable, making it possible to control the surface energy of the substrate. The functionalisation layer 210 may also be formed of a self-assembled monolayer (SAM). Preferably, the functionalisation layer 210 has a substantially constant thickness, comprised between 2 nm and 15 nm.

Preferably, the functionalisation layer 210 is a neutralisation layer. In other words, the first material is neutral with regard to the block copolymer. This first material may be a polymer of which the surface energy corresponds to a neutrality regime of the block copolymer intended to occupy the cavities 310 of the guide 300. It may notably be a random copolymer of same chemical nature (i.e. comprising the same monomers) as this block copolymer.

As an example, when the block copolymer is PS-b-PMMA of cylindrical morphology, the functionalisation layer 210 may be a layer of the random copolymer PS-r-PMMA, comprising 70% by weight of polystyrene (PS) and 30% by weight of polymethyl methacrylate (PMMA). When the block copolymer is PS-b-PMMA of lamellar morphology, the first functionalisation layer may be a PS-r-PMMA layer, comprising 50% by weight of PS and 50% by weight of PMMA.

Step S1 of forming the functionalisation layer 210 preferably comprises an operation of depositing a layer formed of the first polymer material, for example by spin coating, an operation of fixing, also called grafting, the layer of the first polymer material onto the surface of the substrate 200, and an operation of rinsing during which surplus polymer material (i.e. non-grafted material) is removed using a solvent. In an alternative embodiment, where the first polymer material is cross-linkable rather than graftable, the spin coating operation is followed by a thermal annealing in order to cross-link the first polymer material.

The substrate 200 comprises at least one active layer, in which it is provided to transfer the secondary patterns obtained by the assembly of the block copolymer, for example with the aim of forming contact holes. The substrate 200 is preferably comprised of a stack of several layers, comprising a base layer 201 made of semiconductor material, for example silicon, at least one active layer (for example made of oxide or nitride) and at least one organic layer (e.g. SOC, SOG, BARC, etc.). The number and the nature of the layers of the stack vary as a function of the envisaged application.

Figure 3B:
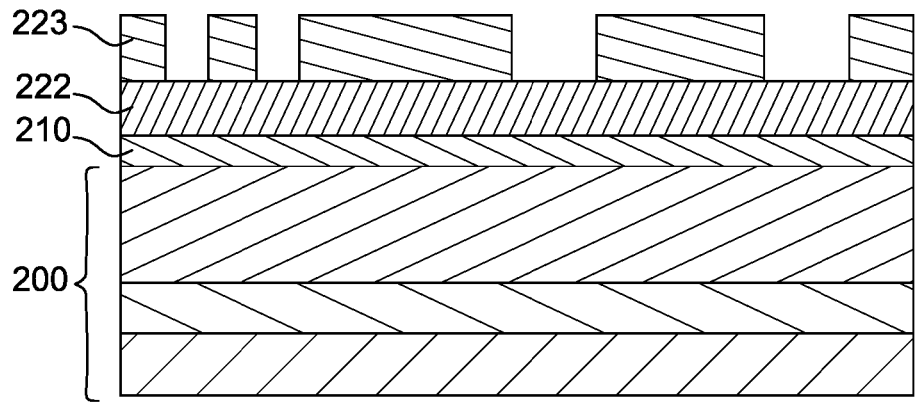
Figure 3C:
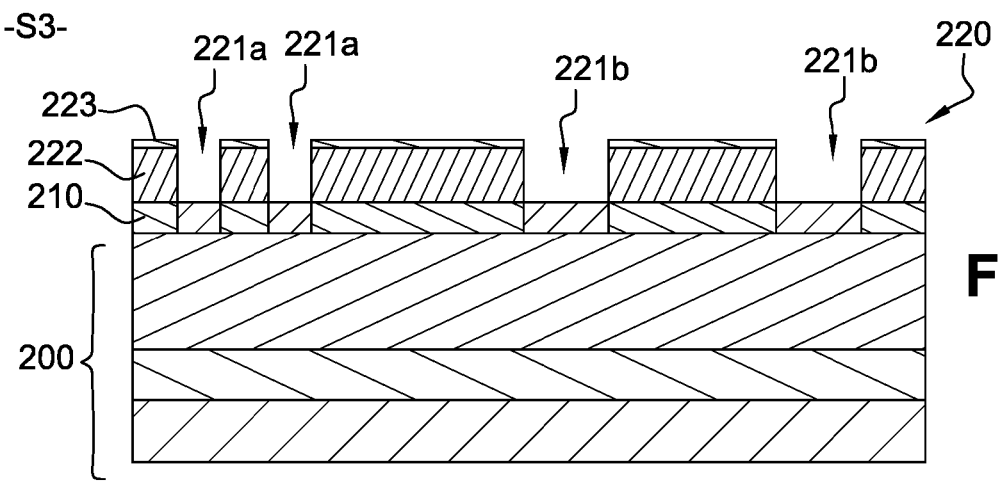

Steps S2 and S3, illustrated by FIGS. 3B and 3C, have the aim of forming a mask 220 on the functionalisation layer 210. This mask 220 comprises one or more recesses, of which the shape and the dimensions correspond to the pattern(s) of the assembly guide 300 that it is wished to form. In other words, the solid parts of the mask 220 define the future cavities 310 of the assembly guide 300 (cf. FIG. 2). In the example represented in FIGS. 2 and 3, it is wished to form an assembly guide 300 comprising two peripheral assembly patterns 320*a*-320*b* (in top view), that is to say of closed contour. The mask 220 then comprises two recesses 221*a*-221*b*, also of peripheral shape (cf. FIG. 3C). Alternatively, the assembly patterns 320*a*-320*b* are lines that define between them a trench corresponding to the cavity 310.

The mask 220 is, in this embodiment of the method, a hard mask formed by photolithography and etching. At step S2 of FIG. 3B, the functionalisation layer 210 is covered with at least one inorganic material layer 222, then a photosensitive resin layer 223. The inorganic material layer 222 is preferably an anti-reflective layer, for example a Silicon Anti-Reflective Coating (SiARC), in order to improve the quality of the photolithography. The photosensitive resin layer 223 is next exposed and developed, in order to reveal the future patterns of the assembly guide. At step S3 (FIG. 3C), the patterns printed in the resin layer 223 are transferred into the underlying SiARC layer 222, thereby forming the recesses 221*a*-221*b* of the mask 220. For this transfer, a dry etching method, by plasma, may be employed.

The recesses 221*a*-221*b* of the mask 220 advantageously open onto the functionalisation layer 210. This implies etching the SiARC layer 222 over its whole height during step S3 of FIG. 3C. In this way, the side walls of the cavities of the assembly guide will be entirely functionalised.

During the step of etching S3 the recesses 221*a*-221*b* (FIG. 3C), the chemical affinity of the portions of the functionalisation layer 210 situated at the bottom of the recesses may have been modified by the plasma. This will not however have any incidence on the assembly of the block copolymer, because these portions will not constitute the bottom of the cavities 310 and thus will not be in contact with the block copolymer. As a reminder, the bottom of the future cavities is situated under the solid parts of the mask 220.

Figure 3D:
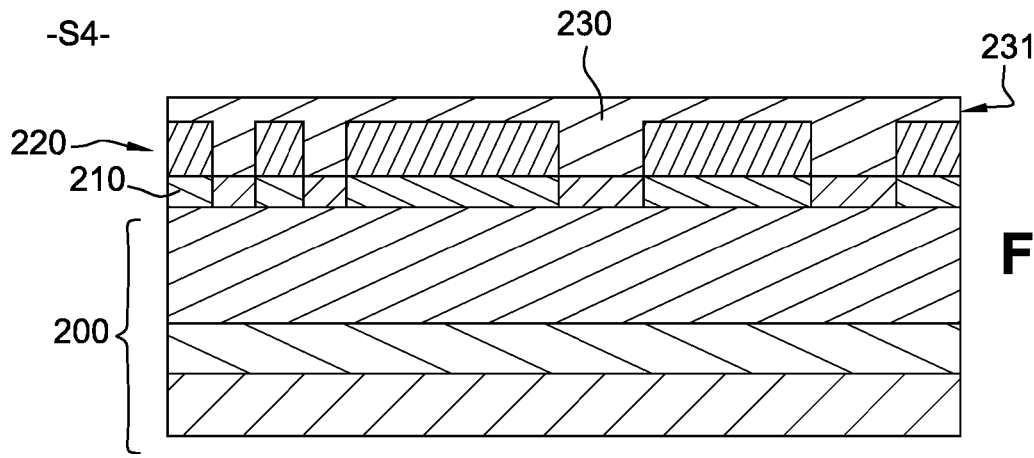
Figure 3E:
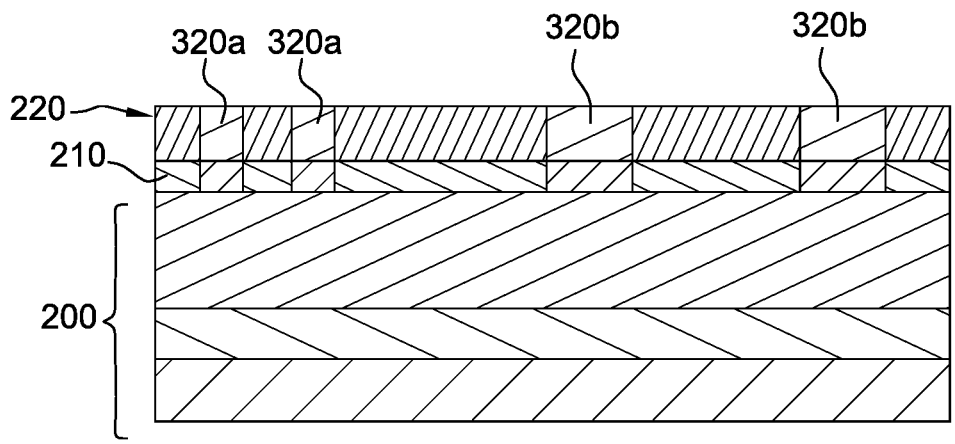

Step S4 of FIG. 3D consists in depositing a second material 230 on the functionalisation layer 210 and the mask 220. This second material 230 is selected as a function of the chemical affinity that it is wished to give to the guide patterns 320*a*-320*b*, of which the sides will form the side walls of the cavities 310 (cf. FIG. 2). The second material 230 may be a cross-linkable polymer material, like the first material of the functionalisation layer 210, a silicon oxide, a silicon nitride, a titanium nitride or a metal such as gold, copper, platinum and palladium.

Preferably, the second material 230 has a preferential affinity for one of the copolymer blocks. For example, in the case of the di-block copolymer PS-b-PMMA, the second material 230 may be PMMA-affine or PS-affine. Styrene derivatives and methacrylate derivatives are respectively examples of PS-affine and PMMA-affine material. Coupled to the "neutral" character of the functionalisation layer 210, this preferential affinity with regard to one of the copolymer blocks makes it possible to orient the secondary patterns of the block copolymer (made of PS or PMMA, depending on the case) perpendicularly to the substrate 200.

When the mask has a uniform opening ratio, it is possible to only fill partially the recesses 221*a*-221*b* of the mask 220. The thickness of the block copolymer layer in the recesses 221*a*-221*b* will be substantially constant.

In the configuration illustrated in FIG. 3D, where the mask has a non-uniform opening ratio (in this particular instance two recesses 221*b* wider than the two recesses 221*a*), the second material 230 is advantageously deposited in such a way as to fill entirely the recesses 221*a*-221*b* of the mask 200 and to form an extra thickness layer 231 above the mask. The deposition conditions are advantageously selected so as to obtain a uniform extra thickness layer 231, that is to say of substantially constant thickness. To do so, the extra thickness 231 is preferably equal to around then times the depth of the recesses 221*a*-221*b*, or even greater than ten times this depth. For example, for recesses of around 35 nm depth, it will be sought to obtain an extra thickness of the order of 300 nm.

The deposition of the second material 230 is advantageously carried out by spin coating. A solution containing a solvent and the second material (typically a polymer) is spread out over the substrate 200 (covered with the functionalisation layer 210 and the mask 220), by centrifugal force. This deposition mode is particularly suited to levelling out a surface topography, such as that generated by the recesses of the mask 220, and thus to obtain a flat surface. Moreover, it may be carried out at ambient temperature. The risk of degrading the functionalisation layer 210 made of polymer material is then zero.

Other deposition modes may be envisaged according to the nature of the second material, for example PECVD (Plasma-Enhanced Chemical Vapour Deposition, notably in the case of oxides) and CVD (Chemical Vapour Deposition). The deposition preferably takes place at low temperature (<300° C.) in order not to alter the functionalisation layer 210.

Then, at step S5 of FIG. 3, the extra thickness layer 231 formed of the second material 230 is removed in order to uncover the mask 220. The removal of the second material 230 is carried out preferably down to the upper face of the mask 220, in order to obtain patterns 320*a*-320*b* made of second material of same thickness as the mask 220. In other words, the patterns 320*a*-320*b* of FIG. 3E are entirely contained in the recesses of the mask 220. Thus, this step S5 may be called "planarization step", with reference to the flat surface formed by the patterns 320*a*-320*b* of the second material and the mask 220.

In an embodiment of step S5, the extra thickness layer 231 made of second material is removed by chemical mechanical planarization (CMP). In this case, to obtain a flat surface at the end of step S5, it is not very important that the extra thickness layer 231 is initially of constant thickness.

In an alternative embodiment, the extra thickness layer 231 is removed by plasma etching. The etching chemistry is advantageously selected so as to obtain good etching selectivity relative to the SiARC of the mask 220. This makes it possible to better control the removal of the second material while stopping selectively on the mask 220. The mask 220 then constitutes an etching stop layer. As an example, when the extra thickness layer is an organic layer, an oxidising chemistry (based on $O_2$, mixed with $N_2$ for example) or a reducing chemistry (based on $H_2$, mixed with $N_2$ for example) may be used.

Since the thickness etched by the plasma is substantially the same at all points of the substrate, it is preferable to start from a uniform extra thickness layer 231 to end up with a planeness between the solid parts of the mask 220 and the patterns 320*a*-320*b* of the second material. An extra thickness of the order of—or even greater than—ten times the depth of the recesses will be selected for this.

It is also possible to combine chemical mechanical planarization (CMP) and plasma etching to remove the extra thickness layer 231. It is moreover preferable to firstly carry out a CMP operation to roughly cut down the extra thickness layer 231, then an operation of selective plasma etching, in order to finish the removal while stopping with precision on the mask 220.

Thus, by making the second material 230 extend beyond the mask 220 at step S4, then by planing it down to the height of the mask 220 at step S5, it is guaranteed that all the patterns 320a-320b of the assembly guide will have the same thickness on the functionalisation layer 210, whatever their number, their dimensions and their distribution on the functionalisation layer 210.

Finally, at step S6 (FIG. 3F), the mask is selectively etched relative to the first material of the functionalisation layer 210 and the second material, in order to release the patterns 320a-320b of the assembly guide 300. This step may be qualified as inversion step, because the guide patterns 320a-320b are the negative of the patterns printed in the resin layer 223 at step S2 of FIG. 3B.

In order not to modify the chemical affinity of the portions of the functionalisation layer 210 which constitute the bottom 311 of the cavities 310, the SiARC mask is advantageously etched by wet process, for example in a hydrofluoric acid bath. Indeed, other types of etching and notably plasma etching, although they may be envisaged, would risk modifying the chemical affinity of the bottom 311 of the cavities 310.

A particular exemplary embodiment of steps S1 to S6 (FIGS. 3A to 3F) is given hereafter. The substrate 200 comprises, from bottom to top, a bulk silicon layer 201, a silicon dioxide ($SiO_2$) layer 202 and a spin-on-carbon (SOC) layer 203.

Firstly, at step S1 (FIG. 3A), over around 30 nm thickness is deposited a solution of PS-r-PMMA diluted to 2% in weight concentration in propylene glycol methyl ether acetate (PGMEA). This deposition is followed by a grafting annealing at 230° C. for 10 min and rinsing with PGMEA, thereby forming a grafted PS-r-PMMA layer of around 8 nm thickness on the carbon layer 203. This grafted PS-r-PMMA layer will serve as neutralisation layer 210.

In S2 (FIG. 3B), the PS-r-PMMA layer 210 is covered with a SiARC layer 222 of around 30 nm thickness, deposited by spin coating and annealed at 215° C. for 5 min, then with a negative tone development resist resin layer 223. Then, line type patterns are printed in the resin layer, of around 100 nm thickness.

In S3 (FIG. 3C), the patterns printed in the resin layer 223 are transferred by etching into the entire thickness of the SiARC layer 222, in order to form the mask 220. The transfer of the patterns may be obtained by means of a fluorocarbon plasma ($CH_xF_y$), for example $CH_2F_2$ (20 sccm)+$CF_4$ (40 sccm)+He (240 sccm) for 15 seconds. It may be carried out in a capacitive or inductive coupling reactor.

In S4 (FIG. 3D), a cross-linkable polystyrene 230, diluted to more than 5% in weight concentration in PGMEA, is deposited in the recesses of the SiARC mask 220. The diluted polystyrene is deposited by spin coating at a speed of 1500 rpm for 30 seconds. The mask 220 is then covered with a polystyrene layer 231 of substantially constant thickness, of the order of 300 nm.

In S5 (FIG. 3E), the polystyrene layer 231 is etched by an oxygen or hydrogen based plasma diluted or not with gases such as $N_2$, Ar, etc. until the SiARC mask 220 is reached. The etching comes to an end by detection of end of attack of the polystyrene layer 231 (by in situ monitoring of the wavelength corresponding to the etching of this polymer). The substrate is next taken to a temperature of 180° C. for 100 min to cross-link the polystyrene, which confers on the material good thermal resistance.

Finally, in S6 (FIG. 3F), the SiARC mask 220 is etched in a hydrofluoric acid bath of weight concentration equal to 0.1% for 30 seconds. This type of wet etching leaves intact the PS-r-PMMA of the neutralisation layer 210 and the cross-linked polystyrene. The functionalised assembly guide 300 is then formed. It comprises polystyrene patterns 320a-320b and a neutralisation layer 210, on which lie the polystyrene patterns (cf. FIG. 3F)

Figure 4:
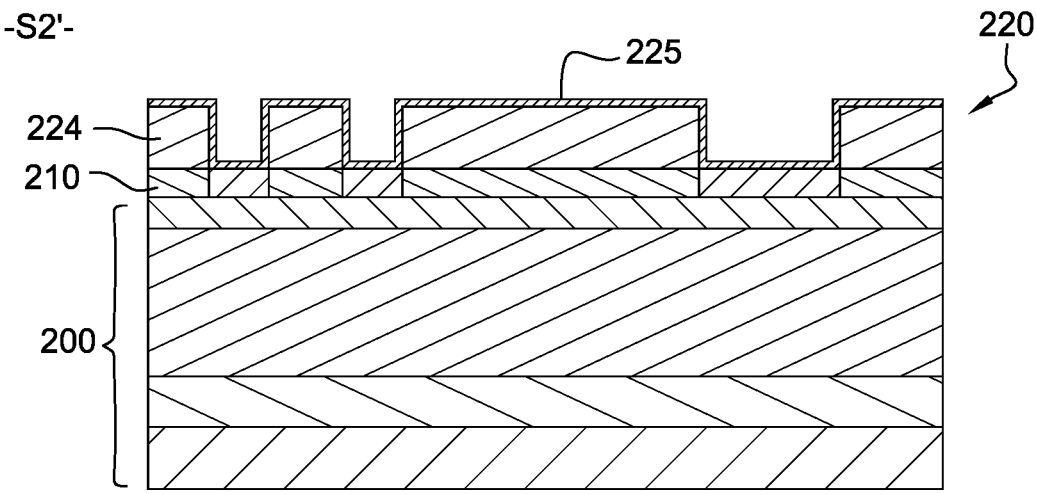
FIG. 4 represents a step S2' replacing steps S2 and S3 of FIGS. 3B and 3C, according to an alternative embodiment of the method according to the invention.

FIG. 4 represents an alternative embodiment S2' of the steps making it possible to form the mask 220 on the functionalisation layer 210 (S2 and S3).

In this alternative embodiment, the mask 220 comprises a photosensitive resin layer 224, rather than an inorganic layer (hard mask). Thus, at step S2', the resin layer 224 is deposited on the functionalisation layer 210, insolated then developed in order to form the recesses 221a-221b of the mask 220.

Using a resin layer rather than an inorganic layer to form the mask makes it possible to reach more easily greater heights of guide patterns. Moreover, this alternative embodiment is cheaper, because the formation of the mask includes one fewer step (no transfer of the patterns formed into the resin layer).

On the other hand, a mask 220 made of resin, that is to say made of polymer material, may make the planing down by plasma of step S5 more difficult. Indeed, when the second material 230 deposited in the recesses of the mask is also a polymer material, there may exist a lack of chemical contrast, which does not make it possible to remove the second material 230 selectively relative to the material of the mask 220. To solve this problem, the resin layer 224 is advantageously covered, after development, with a thin stop layer 225 of "liner" type, in other words deposited in a conformal manner on the resin layer 224 and the functionalisation layer 210. This stop layer 225, preferably made of oxide or nitride, protects the resin layer 224 from the plasma etching of the second material. The stop layer 225 has, preferably, a thickness comprised between 5 nm and 10 nm.

Figure 3F:
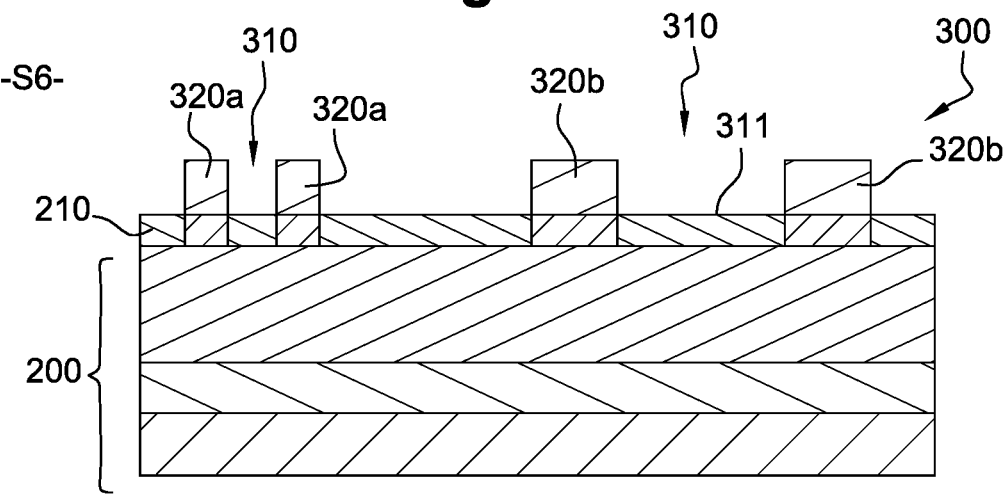

After step S5 of planing down the second material 230 (FIG. 3E), the stop layer 225 covering the resin mask 220 is removed, for example in a hydrofluoric (HF) acid bath, then the resin mask 220 is removed, preferably by means of a solvent (step S6; FIG. 3F).

FIGS. 5A to 5E represent an alternative embodiment of the method for forming a functionalised assembly guide according to the invention. In this alternative, a first series of guide patterns 320 is produced thanks to the steps S1 to S5 described previously in relation with FIGS. 3A to 3E. This first series of patterns is going to make it possible to create one (or more) first cavity or cavities 310 of which the walls have an affinity corresponding to the material of these patterns. At the stage of FIG. 3E, rather than removing the mask 220 (step S6, FIG. 3F), it is next possible to produce a second mask 250 by creating new openings 251 in the SiARC layer 222, by lithography and etching (preferably in a manner similar to steps S2 and S3). These openings 251 are going to make it possible to create a second series of patterns 330 delimiting one (or more) second cavity or cavities 340 of which the affinity of the walls is different from the affinity of the walls of the first cavity 310.

Figure 5A:
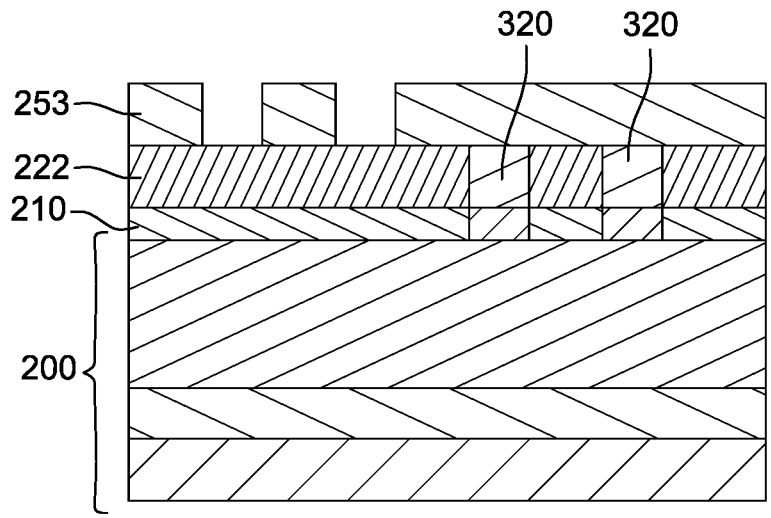
FIGS. 5A to 5E represent optional steps S7-S11 of the method according to the invention, following on from step S5 of FIG. 3E.
Figure 5B:
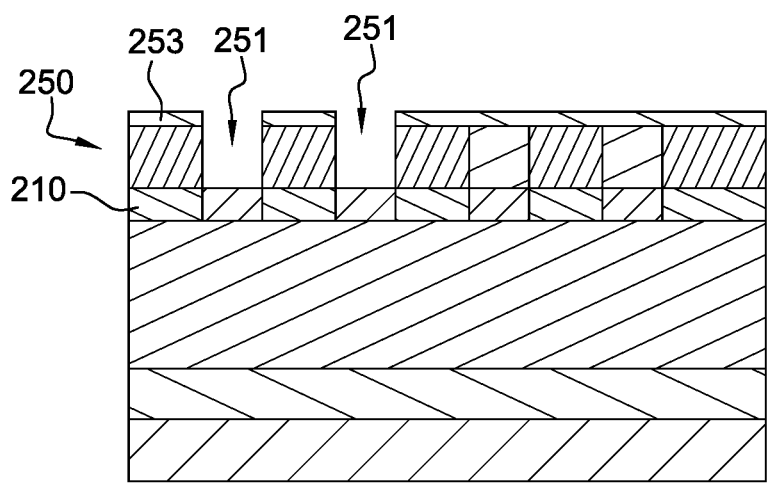

To do so, at step S7 of FIG. 5A, the patterns 320 of the first series and the SiARC layer 222 that surrounds them are covered with a second photosensitive resin layer 253. This photosensitive resin layer 253 is next exposed and developed, in order to reveal the future patterns of the second series.

At step S8 (FIG. 5B), the patterns printed in the second resin layer 253 are transferred into the underlying SiARC layer 222, thereby forming the second mask 250 comprising the recesses 251. For this transfer, a dry etching method, by plasma, may be employed. The recesses 251 of the second mask 250 open onto the functionalisation layer 210.

Alternatively, it is possible from the structure of FIG. 3F (i.e. once the first mask 220 has been removed) to deposit a new inorganic material layer to produce the second mask 250. This inorganic material layer is preferably an antireflective layer, for example a Silicon Anti-Reflective Coating (SiARC). The deposition of a new inorganic layer makes it possible to confer on the second mask 250 better properties, since unlike the first SiARC layer 222, the second SiARC layer will not have undergone an aggressive step, such as CMP or plasma etching to remove the second excess material.

Figure 5C:
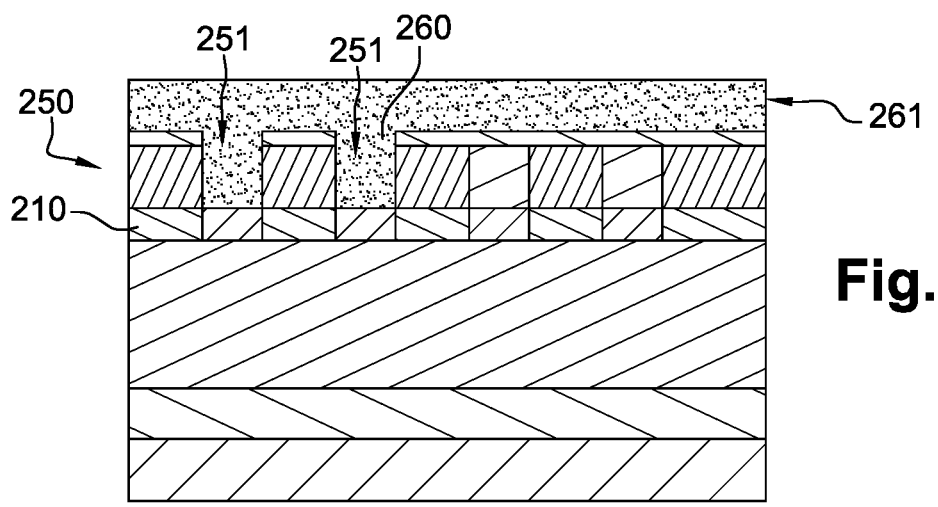

Step S9 of FIG. 5C consists in depositing a third material 260 on the functionalisation layer 210 and the second mask 250. This third material 260 is selected as a function of the chemical affinity that it is wished to give to the guide patterns 330 of the second series, of which the sides will form the side walls of the second cavity 340. The third material 260 may be of same nature as the second material 230 but will advantageously have an affinity with regard to the block copolymer different to that of the second material.

For example, if the second material 230 has a preferential affinity for one of the copolymer blocks, the third material 260 may have a preferential affinity with regard to the other block. Coupled to the "neutral" character of the functionalisation layer 210, these preferential affinities will make it possible to orient the secondary patterns of the block copolymer perpendicularly to the substrate 200 along the walls of the cavities 310 and 340, but with a different location of the blocks between the two cavities.

In another example, the second material 230 has a preferential affinity for one of the copolymer blocks and the third material 260 has a neutral character with regard to the copolymer, like the functionalisation layer 210. In the first cavity 310 will then be obtained secondary patterns oriented perpendicularly to the substrate and parallel to the walls of the cavity, and in the second cavity 340, secondary patterns oriented perpendicularly to the substrate 200 and perpendicularly to the walls of the cavity.

As illustrated in FIG. 5C, the third material 260 is advantageously deposited in such a way as to fill entirely the recesses 251 of the second mask 250 and to form an extra thickness layer 261 above the second mask 250.

Figure 5D:
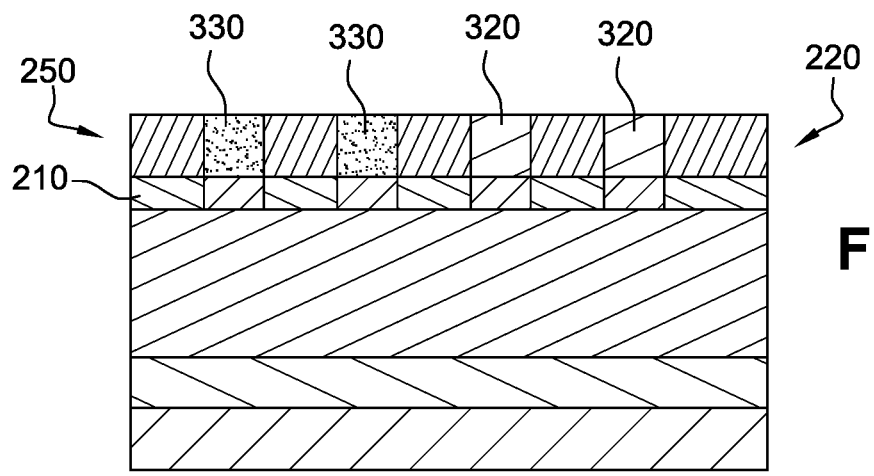
Figure 5E:
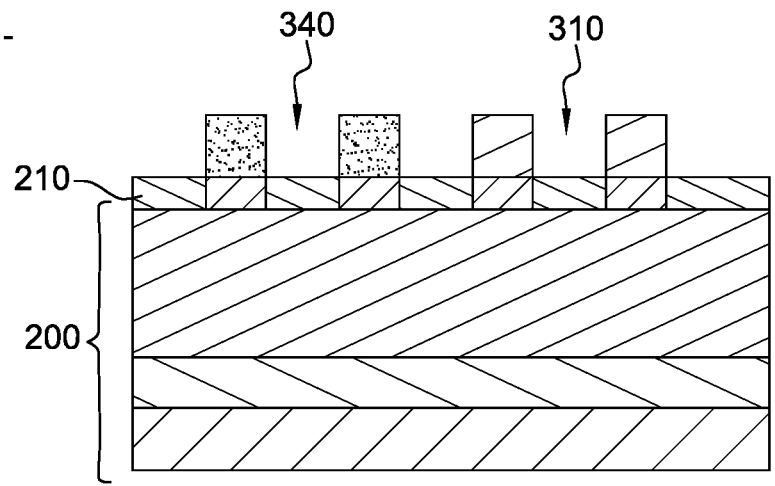

At step S10 of FIG. 5D, the extra thickness layer 261 of the third material is removed by CMP and/or plasma etching in order to uncover the second mask 250 and to obtain the patterns 330 comprised of the third material. When a single and same SiARC layer 222 has been used to form successively the masks 220 and 250, the patterns 330 of the second series are of same thickness as the patterns 320 of the first series.

Finally, in S11 (FIG. 5E), the first mask 220 (of which the recesses are occupied by the patterns 320) and the second mask 250 (of which the recesses are occupied by the patterns 330) are etched selectively relative to the first material of the functionalisation layer 210 and to the second and third materials, in order to release the patterns 320-330 of the assembly guide. The SiARC masks 220 and 250, here arranged side by side, are advantageously etched by wet process, for example in a hydrofluoric acid bath.

The method that has just been described thus makes it possible to manufacture one (or more) assembly guide(s) comprising at least one cavity of which the bottom is functionalised with a first chemical affinity (functionalisation layer 210), whereas the side walls are functionalised with a second chemical affinity (second material 230), or even a third chemical affinity (third material 260).

The assembly guide may next be used in a method for directed self-assembly (DSA) of block copolymers, and more particularly in a graphoepitaxy method, in order to generate patterns of very high resolution and density. This graphoepitaxy method comprises a step of depositing a block copolymer in the cavity (or cavities) of the assembly guide and a step of assembly of the block copolymer, for example by annealing.

This block copolymer may notably be selected from the following:
 PS-b-PMMA: polystyrene-block-polymethyl methacrylate;
 PS-b-PLA: polystyrene-block-polylactic acid;
 PS-b-PEO: polystyrene-block-polyethylene oxide;
 PS-b-PDMS: polystyrene-block-polydimethylsiloxane;
 PS-b-PMMA-b-PEO: polystyrene-block-polymethyl methacrylate-block-polyethylene oxide;
 PS-b-P2VP: polystyrene-block-poly(2vinylpyridine).

Of course, the method for forming an assembly guide according to the invention is not limited to the embodiments described with reference to FIGS. 3 to 5 and many variants and modifications will become clear to those skilled in the art. In particular, the first material of the functionalisation layer, the second material and the third material could have other compositions than those described previously. Similarly, other block copolymers could be used.

The first chemical affinity (cavity bottom) is not necessary different from the second chemical affinity (lateral wall of the cavities). Indeed, other combinations between the first and second chemical affinities are possible. The assembly guide obtained thanks to the method according to the invention thereby makes it possible to obtain multiple configurations for the secondary patterns of the block copolymer.

Finally, thanks to the method according to the invention, it is possible to form an assembly guide comprising one (or more) cavity or cavities of which certain walls have the second chemical affinity and other walls have a third chemical affinity (or even a fourth affinity, etc.). To do so, it is possible to apply the method of FIGS. 5A to 5E to form a part of the guide patterns delimiting this cavity with the second material and the other part of the guide patterns delimiting this same cavity with the third material.

The invention claimed is:

1. A method for forming a functionalised assembly guide intended for the self-assembly of a block copolymer by graphoepitaxy, comprising:
 forming on a surface of a substrate a neutralisation layer made of a first material having a first neutral chemical affinity with regard to the block copolymer;
 forming on the neutralisation layer a first mask comprising at least one recess;
 after forming the first mask comprising the at least one recess, depositing on the neutralisation layer a second material having a second preferential chemical affinity for one of the copolymer blocks, in such a way as to fill said at least one recess of the first mask; and
 selectively etching the first mask relative to the first and second materials, thereby forming at least one guide pattern made of the second material arranged on the neutralisation layer.

2. The method according to claim 1, wherein said at least one guide pattern delimits at least in part a cavity of depth comprised between 50 nm and 300 nm.

3. The method according to claim 1, wherein the second material is deposited so as to fill entirely said at least one recess of the first mask and to form an extra thickness above the first mask, the method further comprising, before selectively etching the first mask, removing the extra thickness in order to uncover the first mask.

4. The method according to claim 3, wherein the extra thickness of the second material is removed by chemical mechanical planarization.

5. The method according to claim 3, wherein the extra thickness of the second material is removed by plasma etching.

6. The method according to claim 5, wherein the second material is deposited such that the extra thickness of the second material has a flat surface and wherein the second material is etched in a uniform manner.

7. The method according to claim 1, wherein the first mask is etched by wet process.

8. The method according to claim 1, wherein the neutralisation layer is formed of a random copolymer of same chemical nature as the block copolymer, and wherein the second material is selected from a cross-linkable polymer, a silicon oxide, a silicon nitride, a titanium nitride and a metal.

9. The method according to claim 1, wherein the first mask is a hard mask comprising an antireflective layer.

10. The method according to claim 1, wherein the first mask comprises a photosensitive resin layer.

11. The method according to claim 10, further comprising the conformal deposition of a stop layer on the photosensitive resin layer.

12. The method according to claim 1, further comprising:
forming on the neutralisation layer a second mask comprising at least one recess;
depositing a third material having a third chemical affinity with regard to the block copolymer, in such a way as to fill said at least one recess of the second mask; and
selectively etching the second mask relative to the first, second and third materials, thereby forming at least one guide pattern made of the third material arranged on the neutralisation layer.

13. The method according to claim 12, wherein the first and second masks are formed successively in a same inorganic layer and etched simultaneously.

14. The method according to claim 12, wherein the second mask is formed on the neutralisation layer after etching the first mask.

15. A graphoepitaxy method comprising:
forming a functionalised assembly guide using a method according to claim 1, the assembly guide comprising at least one cavity; and
depositing a block copolymer inside the cavity.

16. The method according to claim 1, wherein said first mask is formed on the neutralisation layer so that said first mask is in contact with the neutralization layer made of a first material.

* * * * *